(12) United States Patent
Kim

(10) Patent No.: US 10,671,184 B2
(45) Date of Patent: Jun. 2, 2020

(54) SIGNAL INPUT DEVICE AND ELECTRONIC EQUIPMENT DRIVING DEVICE USING SAME

(71) Applicant: ITVERS CO., LTD., Seoul (KR)

(72) Inventor: Youn Soo Kim, Seoul (KR)

(73) Assignee: ITVERS CO., LTD., Seoul (KR)

( * ) Notice: Subject to any disclaimer, the term of this patent is extended or adjusted under 35 U.S.C. 154(b) by 0 days.

(21) Appl. No.: 15/523,943

(22) PCT Filed: Nov. 2, 2015

(86) PCT No.: PCT/KR2015/011625
§ 371 (c)(1),
(2) Date: May 3, 2017

(87) PCT Pub. No.: WO2016/072672
PCT Pub. Date: May 12, 2016

(65) Prior Publication Data
US 2017/0336876 A1    Nov. 23, 2017

(30) Foreign Application Priority Data

Nov. 3, 2014    (KR) .................. 10-2014-0150883

(51) Int. Cl.
*G06F 3/033*    (2013.01)
*G06F 3/0338*   (2013.01)
(Continued)

(52) U.S. Cl.
CPC ............ *G06F 3/033* (2013.01); *G06F 3/0338* (2013.01); *G06F 3/0362* (2013.01); *H01H 25/041* (2013.01); *H05K 1/185* (2013.01)

(58) Field of Classification Search
CPC ...... G06F 3/033; G06F 3/0362; G06F 3/0338; H01H 25/041; H01H 25/06; H05K 1/185
(Continued)

(56) References Cited

U.S. PATENT DOCUMENTS 8,698,019 B2 *  4/2014  Kim ..................... H01H 25/002
                                                      200/17 R
2012/0006660 A1 * 1/2012 Kim ..................... H01H 25/002
                                                      200/16 R

FOREIGN PATENT DOCUMENTS

JP      H08115637 A       5/1996
KR   10-2010-0102913 A    9/2010
(Continued)

*Primary Examiner* — Edwin A. Leon
*Assistant Examiner* — Lheiren Mae A Caroc
(74) *Attorney, Agent, or Firm* — Bayramoglu Law Offices LLC

(57) ABSTRACT

A signal input device, according to one embodiment of the present invention, comprises: a base member including a bottom surface and a protruding part upwardly protruding from the bottom surface; a push button located on the upper side of the protruding part, and having a downward sidewall formed so as to cover the protruding part; a sensor unit provided on any one of an outer side surface of the protruding part or an inner side surface of the downward sidewall; and a contact point provided on the side, on which the sensor unit is not provided, of the outer side surface of the protruding part or on the inner side surface of the downward sidewall, wherein when the push button moves in a lateral direction, the sensor and the contact point come into contact with each other so as to generate a signal.

28 Claims, 4 Drawing Sheets

(51) Int. Cl.
*G06F 3/0362* (2013.01)
*H01H 25/04* (2006.01)
*H05K 1/18* (2006.01)

(58) Field of Classification Search
USPC .......... 200/547, 5 E, 4, 6 A, 6 R, 8 R, 9, 18,
200/17 R; 273/148 B; 463/38
See application file for complete search history.

(56) References Cited

FOREIGN PATENT DOCUMENTS

| | | |
|---|---|---|
| KR | 10-2010-0118858 A | 11/2010 |
| KR | 10-2013-0019768 A | 2/2013 |
| WO | WO2013058543 A2 | 4/2013 |
| WO | WO2014030949 A1 | 2/2014 |

\* cited by examiner

SIGNAL INPUT DEVICE AND ELECTRONIC EQUIPMENT DRIVING DEVICE USING SAME

CROSS REFERENCE

This application is the national phase of International Application No. PCT/KR2015/011625, filed on Nov. 2, 2015, which is based upon and claims priority to Korean Patent Application No. 10-2014-0150883, filed on Nov. 3, 2014, the entire contents of which are incorporated herein by reference.

TECHNICAL FIELD

The present disclosure relates to a signal input device configured to generate an input signal when a button is pushed sideward and an electronic equipment driving device using the same, and more particularly, to a push type signal input device configured to generate different types of input signals according to a direction in which a button is pushed without a separate pressure sensor and an electronic equipment driving device using the same.

BACKGROUND

Nowadays, as various electronic products that can be remotely controlled such as a smart computer or an internet protocol television are released, various types of signal input devices for remotely inputting a signal into the electronic products are also being provided. The most typical example of such remote signal input devices is a remote controller. An ordinary remote controller has a plurality of buttons, which are capable of controlling functions of a product, installed therein.

Button implementation methods in a conventional remote controller implement a single function with a single button by a switch type or a button pressing type and implement a short cut button to promote user convenience with respect to various functions of an electronic product. However, because the number of buttons is gradually increased to implement numerous functions in a single remote controller, the size of the remote controller is gradually being increased, and the structure of the remote controller is gradually becoming more complicated. When the structure of the remote controller becomes complicated in this way, because it is difficult for a user to easily figure out where a button for a desired function is located, there is a problem of inconvenience in use.

Meanwhile, as a way to solve the above problem, a multifunction button in which about two functions can be performed by a single button can be implemented. Such a multifunction button is configured so that a desired function can be selected using an arrow button in a key code converting mode. When such a multifunction button is used, although the number of function buttons is reduced, because an arrow button is still necessary, there are disadvantages in that a limitation exists in reducing the number of function buttons and an operation becomes complicated.

The prior art document below relates to a slide switch and does not contain the gist of the present disclosure.

PRIOR ART DOCUMENT

1) Japanese Unexamined Patent Application, First Publication No. H08-115637

SUMMARY OF THE INVENTION

Technical Problem

The present disclosure has been devised to solve the above problem and is directed to providing a push type signal input device configured to generate an input signal when an operating force which pushes sideward is applied, in which different types of input signals are generated according to a direction of the operating force and the operating force which pushes sideward can be sensed even without a separate pressure sensor.

Technical Solution

According to an embodiment of the present disclosure, a signal input device includes a base member that includes a bottom surface and a protruding part protruding upward from the bottom surface, a push button disposed above the protruding part and having a downward sidewall formed to surround the protruding part, a sensor unit disposed at any one of an outer surface of the protruding part and an inner surface of the downward sidewall, and a contact point disposed at the other one of the outer surface of the protruding part and the inner surface of the downward sidewall. When the push button moves sideward, the sensor and the contact point come into contact, and a signal is generated.

The signal input device may further include an elastic member configured to restore the push button to its original position.

The elastic member may be disposed between the outer surface of the protruding part and an inner surface of the push button.

A first support part may be formed to protrude upward from an upper surface of the protruding part, and the elastic member may be disposed between the first support part and the inner surface of the downward sidewall.

A first support part may be formed to protrude upward from the upper surface of the protruding part, a second support part may be formed to protrude downward from a lower surface of the push button, and the elastic member may be disposed between the first support part and the second support part.

A third support part may be formed to protrude downward from the lower surface of the push button, an insertion groove into which the third support part is inserted may be formed at the upper surface of the protruding part, and the elastic member may be disposed between the third support part and an inner surface of the insertion groove.

A fourth support part may be formed to protrude upward at a position at the bottom surface spaced apart from the outer surface of the protruding part, and the elastic member may be disposed between the fourth support part and an outer surface of the downward sidewall.

The signal input device may further include a cover configured to surround the fourth support part and the elastic member.

All engaging protrusion may be formed at a lower end of the downward sidewall, an engaging hole may be formed in a region of the bottom surface corresponding to the engaging protrusion, and the base member and the push button may be coupled by the engaging protrusion being inserted into the engaging hole.

A locking step configured to prevent the push button from being detached from the base member after the engaging protrusion is inserted into the engaging hole may be formed at the engaging protrusion.

The sensor unit may be a flexible printed circuit board disposed at an outer circumference of the protruding part or an inner circumference of the downward sidewall, the flexible printed circuit board may include a center line extending in a horizontal direction and a first branching line branched from the center line, and at least one sensor may be disposed at the center line.

A switch may be disposed at the first branching line, and the switch may be disposed at the upper surface of the protruding part.

A switch may be disposed at the first branching line, a switch seating groove may be formed at the upper surface of the protruding part, and the switch may be disposed in the switch seating groove.

The signal input device may further include a pressing button configured to apply a pressure to the switch to operate the switch.

A first through-hole may be formed in the push button, the pressing button may include a first button part disposed above the push button and a second button part disposed below the push button, the first button part may include a contact part formed to be pressed by a user and a first engaging part formed to extend from below the contact part to be inserted into the first through-hole, and the second button part may include a pressing part configured to come into contact with the switch to operate the switch and a second engaging part formed to extend from above the pressing part and inserted into the first through-hole to be coupled to the first engaging part.

At least one of cross-sectional areas of the contact part and the pressing part may be larger than a cross-sectional area of the first through-hole.

A cross-section of the contact part may be formed in a convex shape so that a height of a central portion is larger than a height of a side portion.

A connector may be formed at an end of the first branching line.

A second through-hole passing through the base member may be formed in the protruding part, a switch may be disposed at a position corresponding to the second through-hole in a circuit board of a main body in which the signal input device is installed, and the signal input device may further include a pressing button configured to operate the switch when inserted into the second through-hole and applying a force downward.

The sensor unit may be formed of a terminal switch that includes a positive terminal and a negative terminal, and the contact point may be an electric conductor.

The sensor unit may be a touch sensor or a tactile sensor.

The signal input device may further include a pressing button disposed on the push button and configured to operate a switch disposed therebelow when a downward external force of a reference value or more is applied, mouse pointing may be operated when the push button is pushed sideward, a click signal may be generated when a pressed state of the pressing button is maintained within a predetermined amount of time and then cancelled, and an additional function signal may be generated when the pressed state of the pressing button is maintained over the predetermined amount of time and then cancelled.

A drag signal may be generated when the push button is pushed sideward after the additional function signal is generated.

A drop signal may be generated when the click signal is generated after the drag signal is generated.

A scroll signal may be generated when the push button is pushed sideward after the additional function signal is generated.

The generation of the scroll signal may be cancelled when the click signal is generated after the scroll signal is generated.

The signal input device may further include a pressing button disposed on the push button and configured to operate a switch disposed therebelow when a downward external force of a reference value or more is applied, and a scroll signal or a drag signal may be generated when the push button is pushed sideward in a state in which the pressed state of the pressing button is maintained.

The generation of the scroll signal or the drag signal may be cancelled when the pressed state of the pressing button is cancelled after the scroll signal or the drag signal is generated.

One of the scroll signal and the drag signal may be generated when an amount of time in which the pressed state of the pressing button is maintained is a predetermined amount of time or larger, and the other one of the scroll signal and the drag signal may be generated when the amount of time in which the pressed state of the pressing button is maintained is less than the predetermined amount of time.

According to another embodiment of the present disclosure, an electronic equipment driving device includes a first button part that includes a push button configured to generate a first signal when pushed sideward and a pressing button disposed on the push button and configured to generate a second signal which is different from the first signal when a downward external force of a reference value or larger is applied, and a second button part disposed apart from the first button part and including an arrow key configured to generate a direction signal and a selector key configured to generate a selection signal.

Mouse pointing may be operated when the push button is pushed sideward, an additional signal may be generated when at least one of the pressing button and the selector key is operated after the mouse pointing is operated, and a drag signal may be generated when the push button is pushed sideward during or after the generation of the additional signal.

A selection signal may be generated when at least one of the pressing button and the selector key is operated after the arrow key is operated to generate a direction signal.

Advantageous Effects

A push type signal input device according to the present disclosure and an electronic equipment according to another embodiment have advantages in that the number of buttons included in the signal input device can be decreased because different types of input signals can be generated according to a direction of an operating force which pushes sideward, a configuration can be simplified and a manufacturing cost can be considerably reduced because the operation force which pushes sideward can be sensed without a separate pressure sensor, and two or more input signals can be simultaneously generated.

Further, by a sensor or a contact point part being disposed in a base member that includes a protruding part and a push button being disposed above the base member, there are advantages in that a separate cover member is not required, and a product having a smaller height and a smaller size compared to a conventional signal input device can be provided.

Advantageous effects of the present disclosure are not limited to those mentioned above, and other unmentioned advantageous effects should be clearly understood by one of ordinary skill in the art from the description below.

DETAIL DESCRIPTION OF THE INVENTION

Figure 1:
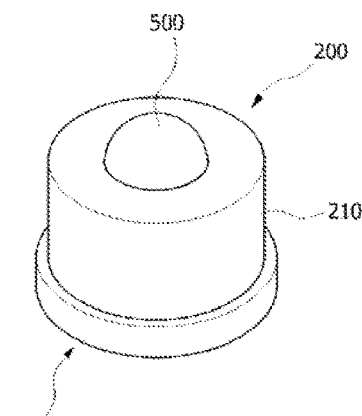
FIG. 1 is a perspective view illustrating a signal input device according to an embodiment of the present disclosure.

Exemplary embodiments according to the present disclosure will be described in detail with reference to the accompanying drawings. Regardless of drawing symbols, like reference numerals will be given to like or similar elements, and overlapping descriptions thereof will be omitted.

In describing the present disclosure, when a detailed description of a known related art is deemed to blur the gist of the present disclosure, the detailed description thereof will be omitted. Also, the accompanying drawings are merely for enabling the spirit of the present disclosure to be easily understood, and it should be noted that the spirit of the present disclosure is not to be interpreted as being limited by the accompanying drawings.

Hereinafter, an overall configuration and functions of a signal input device according to an embodiment of the present disclosure will be described with reference to the accompanying drawings.

Figure 2:
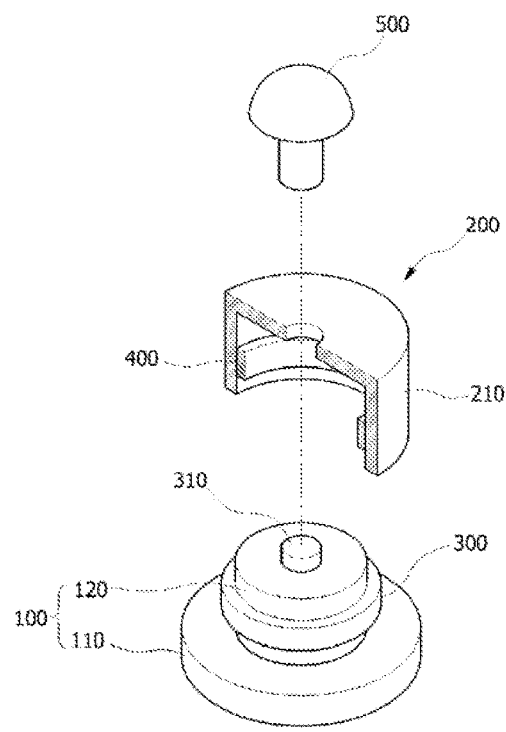
FIG. 2 is an exploded perspective view of the signal input device according to an embodiment of the present disclosure.

FIG. 1 is a perspective view illustrating a signal input device according to an embodiment of the present disclosure, and FIG. 2 is an exploded perspective view of the signal input device according to an embodiment of the present disclosure.

The signal input device according to an embodiment of the present disclosure is a device configured to selectively generate various types of input signals by a single button and includes a base member 100, a push button 200, a sensor unit 300, and a contact point 400 as illustrated in FIGS. 1 and 2. The base member 100 includes a bottom surface 110 and a protruding part 120 protruding upward from a central portion of the bottom surface 110. The push button 200 is disposed above the protruding part 120 and includes a downward sidewall 210 formed downward to surround an outer surface of the protruding part 120.

Further, as illustrated in FIGS. 1 and 2, the sensor unit 300 may be disposed at an outer surface of the protruding part 120, and a contact point 400 may be disposed in a region corresponding to a portion of the outer surface of the protruding part 120 at which the sensor unit 300 is disposed at an inner surface of the downward sidewall 210. Conversely, the sensor unit 300 may be disposed at the inner surface of the downward sidewall 210, and the contact point 400 may be disposed in a region corresponding to a portion of the inner surface of the downward sidewall 210 at which the sensor unit 300 is disposed at the outer surface of the protruding part 120.

In the above structure, when the push button 200 is moved sideward, the sensor 300 and the contact point 400 come into contact with each other, thereby generating a signal. Specifically, the push button 200 is configured to move a predetermined distance sideward such as forward, rearward, leftward, and rightward instead of moving in a vertical direction. When a user pushes the push button 200 sideward, the contact point 400 comes into contact with the sensor unit 300 disposed in a moving direction of the push button 200, and an input signal related to a corresponding sensor among a plurality of sensors formed in the sensor unit 300 is generated. Consequently, the push button 200 should be configured to be movable only in front and rear or left and right directions without rotating. This is because, when the push button 200 is rotatable, a corresponding sensor desired by the user and the contact point may not come into contact with each other and thus an undesired input signal may be generated.

A touch sensor or a tactile sensor may be used as the sensor unit 300. In terms of reducing the manufacturing cost and reducing the weight of the product, the sensor unit 300 is preferably configured as a flexible printed circuit board. That is, at least one sensor may be disposed on the flexible printed circuit board, such a sensor may be formed of a terminal switch that includes a positive terminal and a negative terminal, and the contact point 400 may be formed of an electric conductor so that both the positive terminal and the negative terminal of the terminal switch come into contact with the contact part 400 when the push button 200 is moved sideward and become short-circuited, thereby generating an input signal. Specifically, in the terminal switch, the positive terminal and the negative terminal may be disposed apart from each other in parallel. Further the terminal switch may be formed of a positive terminal 312 and a negative terminal arranged to have portions alternatively arranged in the horizontal direction, i.e., to have a concave-convex pattern and concave and convex portions alternately engaged, and the positive terminal and the negative terminal may be configured to remain slightly apart from each other while being disposed so that the concave and convex portions are alternately engaged with each other. At the same time, for a firm short-circuit between the positive terminal and the negative terminal, the contact point 400 may be formed so that only a contact portion protrudes.

The signal input device according to an embodiment of the present disclosure may further include an elastic member 600 configured to restore the push button 200 to its original position after the push button 200 is moved sideward. An elastic material such as carbon sponge or silicone which is compressed when the push button 200 is moved sideward and applies a restoring elastic force to the push button 200 may be applied as the elastic member 600. An arrangement structure of the elastic member 600 will be described in detail with reference to FIGS. 3 to 6.

FIGS. 3 to 6 are cross-sectional views illustrating various examples of arranging an elastic member in the signal input device according to an embodiment of the present disclosure.

Figure 3:
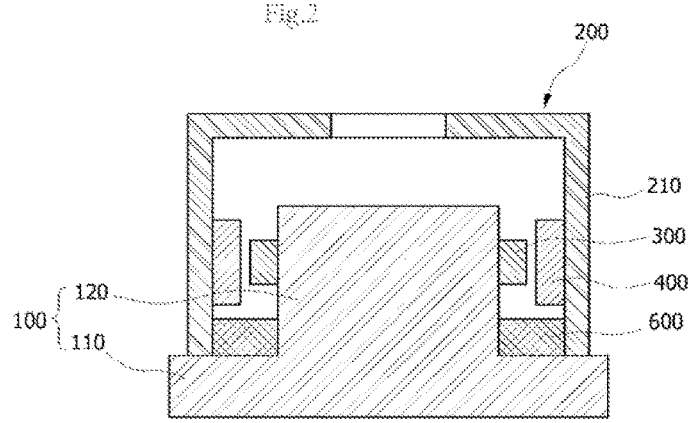
FIGS. 3 to 6 are cross-sectional views illustrating various examples of arranging an elastic member in the signal input device according to an embodiment of the present disclosure.

First, a first example of the arrangement of the elastic member 600 of the signal input device according to an embodiment of the present disclosure will be described with reference to FIG. 3. The elastic member 600 may be configured to be disposed between the outer surface of the protruding part 120 and the inner surface of the push button 200. Here, to not interfere with contact between the sensor unit 300 and the contact point 400, the elastic member 600 is preferably disposed at a position at which the elastic member 600 does not overlap with the sensor unit 300 and the contact point 400.

Figure 4:
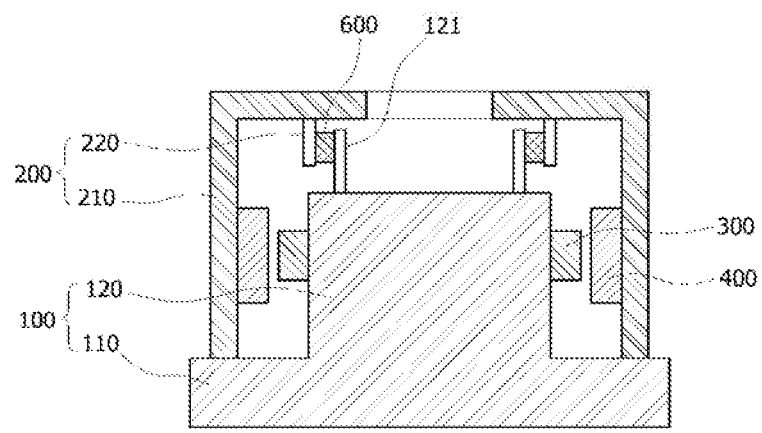

Hereinafter, a second example of the arrangement of the elastic member 600 of the signal input device according to an embodiment of the present disclosure will be described with reference to FIG. 4. As illustrated in FIG. 4, a first support part 121 protruding upward from the upper surface of the protruding part 120 is formed at the protruding part 120, and, a second support part 220 protruding downward from the lower surface of the push button 200 is formed at the push button 200. In this structure, the elastic member 600 may be disposed between the first support part 121 and the second support part 220. The first support part 121 may be continuously formed in a shape corresponding to that of the upper surface of the protruding part 120 or may be formed as a plurality of discontinuous divided bodies at the upper surface of the protruding part 120. Likewise, the second support part 220 may also be continuously formed in a shape corresponding to the lower surface of the push button 200 or may be formed as a plurality of discontinuous divided bodies at the lower surface of the push button 200. Although the first support part 121 is illustrated in FIG. 4 as being formed at an inside of the second support part 220, the second support part 220 may also be configured to be formed at an inside of the first support part 121. Also, the elastic member 600 may be disposed between the first support part 121 and the inner surface of the downward sidewall 210 while only the first support part 121 is formed and the second support part 220 is not separately formed.

Figure 5:
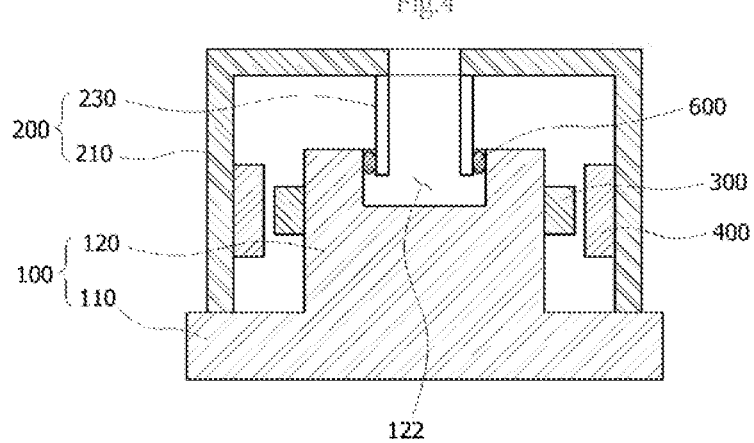

Hereinafter, a third example of the arrangement of the elastic member 600 of the signal input device according to an embodiment of the present disclosure will be described with reference to FIG. 5. As illustrated in FIG. 5, an insertion groove 122 is formed at the upper surface of the protruding part 120, and a third support part 230 protruding downward from the lower surface of the push button 200 is formed at the push button 200. The third support part 230 is inserted into the insertion groove 122, and the elastic member 600 is disposed between the third support part 230 and the inner surface of the insertion groove 122. Here, the third support part 230 should be formed to have a sufficient length to be inserted into the insertion groove 122, and the third support part 230 may be continuously formed in a shape corresponding to that of the lower surface of the push button 200 or may be formed as a plurality of discontinuous divided bodies at the lower surface of the push button 200. For the third support part 230 to be easily accommodated in the insertion groove 122 and the elastic member 600 to be disposed between the third support part 230 and the insertion groove 122 at the same time, a position at the lower surface of the push button 200 at which the third support part 230 is formed should be formed to have a smaller width than that of the insertion groove 122.

Figure 6:
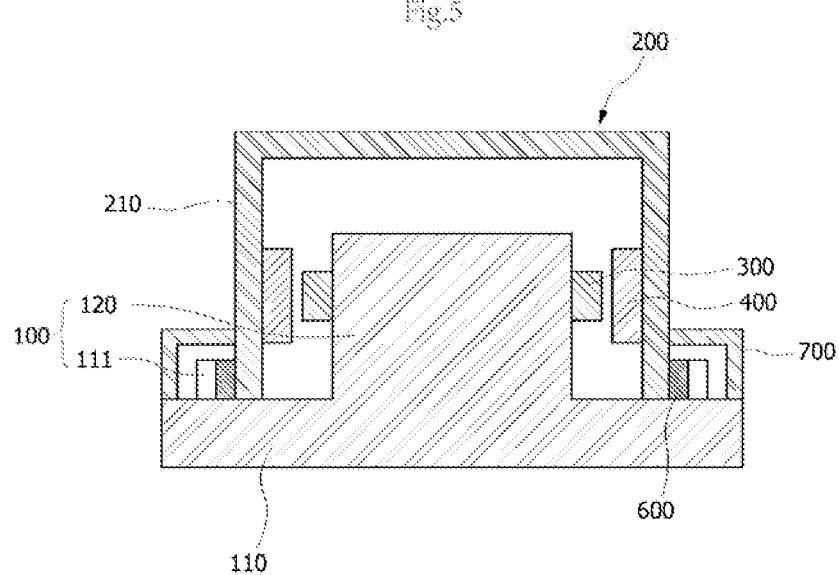

Hereinafter, a fourth example of the arrangement of the elastic member 600 of the signal input device according to an embodiment of the present disclosure will be described with reference to FIG. 6. As illustrated in FIG. 6, a fourth support part 111 is formed to protrude upward at a position at the bottom surface 110 of the base member 100 spaced apart from the outer surface of the protruding part 120, and the elastic member 600 is disposed between the fourth support part 111 and the outer surface of the downward sidewall 210 of the push button 200. The fourth support part 111 may be continuously formed in a shape corresponding to that of the bottom surface 110 or may be formed as a plurality of discontinuous divided bodies at the bottom surface 110. The signal input device may further include a cover 700 configured to surround the fourth support part 111 and the elastic member 600. In this way, the elastic member 600 can be prevented from being easily detached due to an external force, and the fourth support part 111 which is not covered by the push button 200 can be prevented from being easily damaged.

Figure 7:
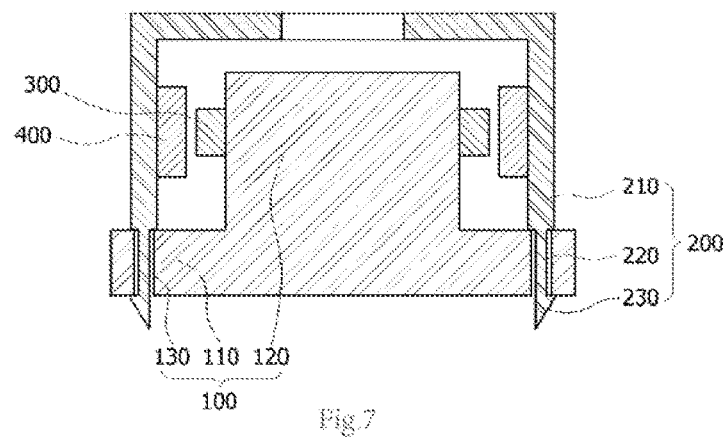
FIG. 7 is a cross-sectional view illustrating an example of coupling between a base member and a push button in the signal input device according to an embodiment of the present disclosure.

Hereinafter, an example of engagement between the base member 100 and the push button 200 in the signal input device according to an embodiment of the present disclosure will be described with reference to FIG. 7. FIG. 7 is a cross-sectional view illustrating an example of coupling between the base member 100 and the push button 200 in the signal input device according to an embodiment of the present disclosure.

As illustrated in FIG. 7, in the signal input device according to an embodiment of the present disclosure, an engaging protrusion 220 is formed at a lower end of the downward sidewall 210 of the push button 200, and an engaging hole 130 is formed at a region corresponding to the engaging protrusion 220 at the bottom surface 110 of the base member 100. In this structure, the base member 100 and the push button 200 are coupled as the engaging protrusion 220 is inserted into the engaging hole 130. Here, a cross-sectional area of the engaging hole 130 formed at the bottom surface 110 of the base member 100 is preferably formed to be larger than a cross-sectional area of the engaging protrusion 220 formed at the downward sidewall 210 to enable sideward movement of the push button 700.

A locking step 230 is preferably formed at the engaging protrusion 220 to prevent the push button 200 from being easily detached from the base member 100 after the engaging protrusion 220 is inserted into the engaging hole 130.

Although the engaging protrusion 220 is illustrated as being formed at the push button 200 and the engaging hole 130 is illustrated as being formed at the base member 100 in FIG. 7, an engaging groove or an engaging hole may be formed at the push button 200, and an engaging protrusion may be formed at the base member 100.

Figure 8:
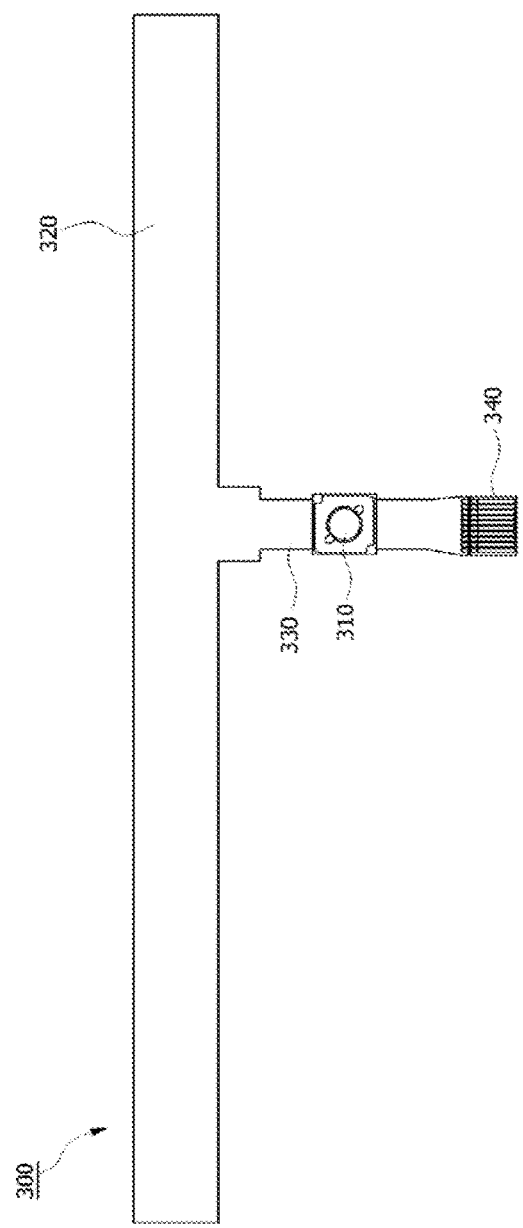
FIG. 8 is a view illustrating a flexible printed circuit board in the signal input device according to an embodiment of the present disclosure.
Figure 9:
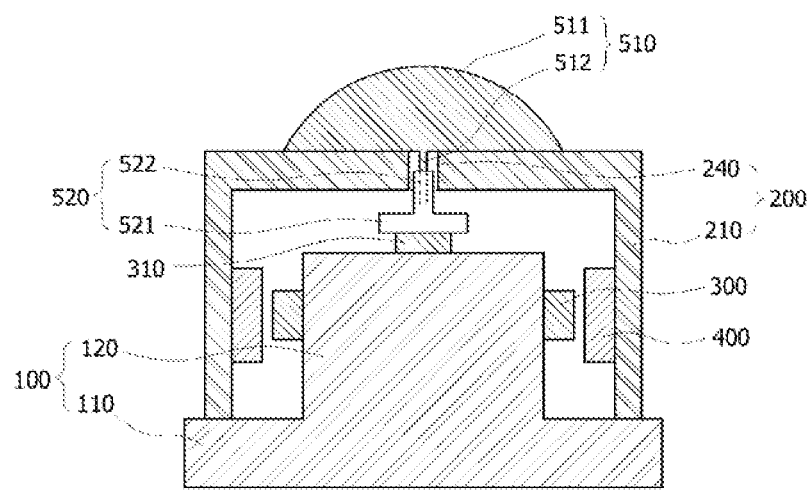
FIG. 9 is a cross-sectional view for describing a shape of a pressing button in the signal input device according to an embodiment of the present disclosure in detail.

Hereinafter, the sensor unit 300 and a pressing button 500 in the signal input device according to an embodiment of the present disclosure will be described with reference to FIGS. 8 and 9. FIG. 8 is a view illustrating a flexible printed circuit board in the signal input device according to an embodiment of the present disclosure, and FIG. 9 is a cross-sectional view for describing a shape of a pressing button in the signal input device according to an embodiment of the present disclosure in detail.

As described above, the sensor unit 300 in the signal input device according to an embodiment of the present disclosure may be formed of the flexible printed circuit board disposed at the outer circumference of the protruding part 120 or the inner circumference of the downward sidewall 210. In this case, as illustrated in FIG. 8, the flexible printed circuit board may mainly include a center line 320 and a first branching line 330. The center line 320 is formed to extend in the horizontal direction, and at least one sensor is disposed thereon. As the sensor, the terminal switch including the positive terminal and the negative terminal may be applied as described above.

Particularly, for input signals generated according to a moving direction of the push button 200 to be clearly differentiated, the sensor is preferably arranged on the flexible printed circuit board so that the sensor can be radially arranged about a vertical central axis of the protruding part 120 when the flexible printed circuit board is disposed to surround the circumference of the outer surface of the protruding part 120. Here, when the signal input device according to an embodiment of the present disclosure is configured to generate a movement signal which moves a mouse cursor or moves a screen, because a movement signal should be basically differentiated into forward, rearward, leftward, and rightward, at least four terminal switches should be provided. Also, eight terminal switches should be provided when attempting to additionally generate movement signals in directions in between the four directions, i.e., in diagonal directions, and twelve terminal switches should be provided when attempting to generate two diagonal movement signals in between each of the four directions. In other words, preferably, the number of terminal switches provided on a single flexible printed circuit board is basically a total of four for each of the four directions, forward, rearward, leftward, and rightward, and is set to be increased by four, i.e., to be a multiple of four.

The first branching line 330 is a configuration branched from the center line 320, and a switch 310 may be disposed at the first branching line 330 as illustrated in FIG. 8. The switch 310 is a configuration configured to generate an input signal that is different from a signal generated by sideward movement of the push button 200 when being operated. The switch 310 may generate a signal independent from the signal generated by sideward movement of the push button 200 and may also generate a composite mixed signal by combining two input signals. Also, a dome switch or a rubber switch may be employed as the switch 310. A connector 340 configured to be connected to a main body such as a remote controller in which the signal input device according to an embodiment of the present disclosure is installed is formed at an end of the first branching line 330. Positions at which the switch 310 or the connector 340 is disposed are not limited to the above-described positions. The switch 310 or the connector 340 may be disposed on another branching line branched from the center line 320 instead of the first branching line or a branching line branched again from the first branching line as necessary.

The arrangement of the switch 310 in the flexible printed circuit board has been described above. However, hereinafter, the arrangement of the switch 310 will be described from a mechanical viewpoint of the signal input device according to an embodiment of the present disclosure. The switch 310 in the signal input device according to an embodiment of the present disclosure may be disposed at the upper surface of the protruding part 120, a switch seating groove may be formed at the upper surface of the protruding part 310, and the switch 310 may be disposed in the switch seating groove. When the switch seating groove is separately formed and the switch 310 is seated therein, because the switch seating groove serves as a guide and the switch 310 can be safely seated in the signal input device, there are advantages in that manufacturing can be facilitated and a seating failure of the switch 310 in a manufacturing step can be reduced.

Hereinafter, the pressing button 500 in the signal input device according to an embodiment of the present disclosure will be described in detail with reference to FIG. 9. As illustrated in FIG. 9, because the switch 310 is not exposed to the outside although the switch 310 is disposed in the signal input device according to an embodiment of the present disclosure, the pressing button 500 should be disposed for a user to apply pressure to the switch 310 to operate the switch 310. For this, as illustrated in FIG. 9, a first through-hole 240 is formed at the push button 200, and the pressing button 500 is disposed above the push button 200 and formed to extend downward to pass through the first through-hole 240 and come into contact with the switch 310.

To prevent the pressing button 500 from being easily detached upward or downward, cross-sectional areas of an upper portion and a lower portion of the pressing button 500 should be formed larger than a cross-sectional area of the first through-hole 240. However, because assembling performance of the signal input device according to an embodiment of the present disclosure may become a problem in this case, to supplement this, the pressing button 500 is preferably configured to be assembled by coupling between a first button part 510 and a second button part 520. Specifically, the pressing button 500 includes the first button part 510 disposed above the push button 200 and a second button part 520 disposed below the push button 200, and the first button part 510 includes a contact part 511 formed to be directly pressed by a user's hand and a first engaging part 512 extending downward from the contact part 511 to be inserted into the first through-hole 240. Also, the second button part 520 includes a pressing part 521 directly coming into contact with the switch 310 to operate the switch 310 and a second engaging part 522 extending upward from the pressing part 521 to be inserted into the first through-hole 240. That is, when the pressing button 500 is formed by the first button part 510 and the second button part being coupled to each other by coupling between the first engaging part 512 and the second engaging part 522, the above-mentioned assembling performance problem can be solved. Further, the contact part 511 directly touched by the user using a finger and the like may be easily manufactured in various shapes and applied as necessary. Particularly, as illustrated in FIG. 9, a cross-section of the contact part 511 may have a convex shape so that a height of a central portion is larger than a height of a side portion. In this way, the user can easily operate the pressing button 500.

Further, unlike the above-described case in which the switch 310 is disposed in the signal input device, the switch may also be installed in a circuit board of a main body in which the signal input device is installed. In this case, a second through-hole completely passing through the base member 100 is formed at the protruding part 310, and a switch is disposed at a position corresponding to the second through-hole at the circuit board of the main body in which the signal input device is installed. The signal input device further includes a pressing button configured to operate the switch. In this case, the pressing button is preferably configured to be inserted into the second through-hole to directly press the switch so that the pressing button can be operated when the user applies a downward force to the pressing button. In this case, because a space for disposing the switch in the signal input device becomes unnecessary, there are advantages in that a signal input device having a smaller size can be provided and a degree of design freedom can be improved.

Also, in a case in which the pressing button 500 is formed by coupling between the first button part 510 and the second button part 520 as described above, the first engaging part 512 and the second engaging part 522 may be inserted into the second through-hole as well as the first through hole 240. Alternatively, the first engaging part 512 may pass through the first through-hole 240 and the second engaging part 522 may pass through the second through-hole so that the first engaging part 512 and the second engaging part 522 are coupled to each other in a space formed between the lower surface of the push button 200 and the upper surface of the protruding part 120.

As described above, the signal input device according to an embodiment of the present disclosure may generate a composite signal by combining a signal generated by the push button 200 and a signal generated by the pressing button 500. Hereinafter, various examples related to this will be described.

Mouse pointing is operated when the push button 200 in the signal input device according to an embodiment of the present disclosure is pushed sideward. That is, a mouse pointing signal is generated as the sensor unit 300 and the contact point 400 come into contact with each other by the sideward movement of the push button 200, and a mouse pointer displayed on a display of an electronic product, a personal computer, etc.) controlled by the signal input device is moved by the mouse pointing signal. Also, a click signal is generated when a pressed state of the pressing button 500 is maintained within a predetermined amount of time and then cancelled. That is, when the mouse pointer displayed on the display of the electronic product is placed on an icon displayed on the display by operation of the push button 200, and the pressing button 500 is maintained within the predetermined amount of time, a program of the corresponding icon can be executed as a click button of a mouse.

An additional function signal may be generated when the pressed state of the pressing button 500 is maintained over the predetermined amount of time and then cancelled, and a drag signal may be generated when the push button 200 is pushed sideward after the additional function signal is generated. That is, when the mouse pointer displayed on the display of the electronic product is placed on the icon displayed on the display using the push button 200, and the pressing button 500 is maintained over the predetermined amount of time and then cancelled, an additional function signal for dragging is generated and the icon is ready to be dragged. Then, when the push button 200 is pushed sideward, dragging, in which the position of the icon is moved in a pushing direction of the push button 200, is performed. Then, when the click signal is generated by the pressed state of the pressing button 500 being maintained within the predetermined amount of time and then cancelled, a drop signal is generated and the dragging state is cancelled.

Also, when the push button 200 is pushed sideward after the additional function signal is generated, a scroll signal may be generated. For example, a web page is scrolled up and down by pushing the push button 200 upward and downward, and this serves as a wheel formed in a mouse. Then, when the click signal is generated by the pressed state of the pressing button 500 being maintained within the predetermined amount of time and then cancelled, the scrolling state is cancelled.

Furthermore, when the push button 200 is pushed sideward in a state in which the pressed state of the pressing button 500 is maintained, the scroll signal or the drag signal may be generated. When the pressed state of the pressing button 500 is cancelled after the scroll signal or the drag signal is generated, the generation of the scroll signal or the drag signal is cancelled. Particularly, any one of the scroll signal and the drag signal is generated when an amount of time in which the pressed state of the pressing button 500 is maintained is the predetermined amount of time or larger, and the other one of the scroll signal and the drag signal may be generated when the amount of time in which the pressed state of the pressing button 500 is maintained is less than the predetermined amount of time.

By implementing such operations, various signals such as the click signal, the mouse pointing signal, the scroll signal, and the drag signal may be generated simultaneously or at different times by using only the two buttons, the push button 200 and the pressing button 500.

Figure 10:
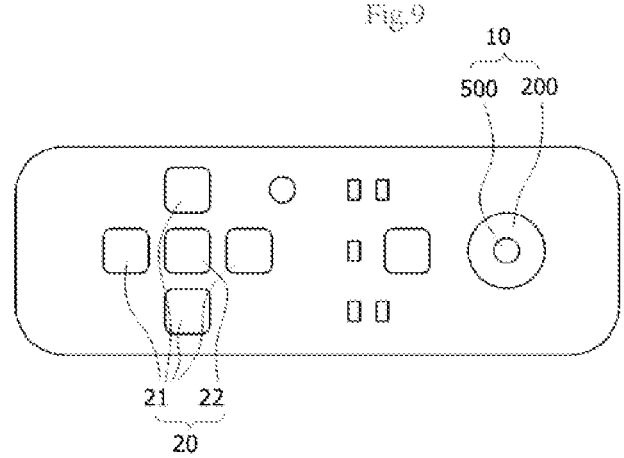
FIG. 10 is a view for describing an electronic equipment driving device according to another embodiment of the present disclosure in detail.

Hereinafter, an electronic equipment driving device according to another embodiment of the present disclosure will be described in detail with reference to FIG. 10. FIG. 10 is a view illustrating an electronic equipment driving device according to another embodiment of the present disclosure.

As illustrated in FIG. 10, an electronic equipment driving device according to another embodiment of the present disclosure includes a first button part 10 and a second button part 20 disposed apart from the first button part 10.

Particularly, the first button part 10 includes a push button 200 and a pressing button 500. The push button 200 generates a first signal when pushed sideward, and the pressing button 500 is disposed on the push button 200 to generate a second signal when a downward external force of a reference value or larger is applied. Consequently, independent signals can be generated by operations of the push button 200 and the pressing button 500, or various signals may be generated by combining operations of the push button 200 and the pressing button 500. The above-described signal input device according to an embodiment of the present disclosure may be employed as the first button part 10, and the first button part 10 may also be configured to have various other forms of structures.

Further, the second button part 20 includes an arrow key 21 configured to generate a direction signal and a selector key 22 configured to generate a selection signal. The arrow key 21 is generally formed of four keys each corresponding to upward, downward, leftward, and rightward as illustrated in FIG. 10, and the selector key 22 is disposed to be surrounded by the arrow keys 21 and configured to generate a signal such as Enter and Select.

The electronic equipment driving device is generally used as a remote controller capable of controlling a TV, a computer, or the like. However, when the user uses both hands to grasp the electronic equipment driving device in the horizontal direction to use the electronic equipment driving device as illustrated in FIG. 10, the electronic equipment driving device may serve as a joy pad for playing a game.

Particularly, mouse pointing may be operated when the push button 200 is pushed sideward, an additional signal may be generated when at least one of the pressing button 500 and the selector key 22 is operated after mouse pointing is operated, and a drag signal may be generated when the push button 200 is pushed sideward during or after the generation of the additional signal. That is, when the user holds the electronic equipment driving device with both hands and plays a game that utilizes Drag & Drop, the user can more conveniently enjoy the game because mouse pointing and a dragging direction are controlled using the push button 200 of the first button part 10, a signal for dragging or dropping is generated using the selector key 22 of the second button part 20, and the first button part 10 and the second button part 20 can be used systematically.

Furthermore, when at least one of the pressing button 500 and the selector key 22 is operated after the arrow key 21 is operated to generate a direction signal, a selection signal may also be generated. That is, when the user holds the electronic equipment driving device with both hands and plays a shooting game in which a target is cleared using a bullet, a beam, or the like by moving an object, the user can more conveniently enjoy the game because the arrow key 21 of the second button part 20 is used for a moving direction of the object, the pressing button 500 of the first button part 10 is used for shooting the bullet, the beam, or the like, and the first button part 10 and the second button part 20 can be used systematically.

Embodiments described herein and the accompanying drawings merely illustrate a part of the technical spirit included in the present disclosure. Consequently, because the embodiments disclosed herein are for describing the technical spirit of the present disclosure instead of limiting the same, it is self-evident that the scope of the technical spirit of the present disclosure is not limited by the embodiments. All modified examples and detailed embodiments that may be easily inferred by one of ordinary skill in the art within the scope of the technical spirit included in the specification and the drawings of the present disclosure should be interpreted as belonging to the scope of the present disclosure.

DESCRIPTION OF REFERENCE NUMERALS

10: First button part
20: Second button part
100: Base member
110: Bottom surface
120: Protruding part
200: Push button
210: Downward sidewall
300: Sensor unit
400: Contact point
500: Pressing button
600: Elastic member
700: Cover

What is claimed is:

1. A signal input device comprising:
    a base member that includes a bottom surface and a protruding part protruding upward from the bottom surface;
    a push button disposed above the protruding part and having a downward sidewall formed to surround the protruding part;
    a sensor unit disposed at any one of an outer surface of the protruding part and an inner surface of the downward sidewall; and
    a contact point disposed at the other one of the outer surface of the protruding part and the inner surface of the downward sidewall,
    wherein, when the push button moves sideward, the sensor and the contact point come into contact, and a signal is generated; and
    an engaging protrusion is formed at a lower end of the downward sidewall; and
    an engaging hole is formed in a region of the bottom surface corresponding to the engaging protrusion; and
    the base member and the push button are coupled by the engaging protrusion being inserted into the engaging hole.

2. The signal input device of claim 1, further comprising an elastic member configured to restore the push button to an original position of the push button.

3. The signal input device of claim 2, wherein the elastic member is disposed between the outer surface of the protruding part and an inner surface of the push button.

4. The signal input device of claim 1, wherein a locking step configured to prevent the push button from being detached from the base member after the engaging protrusion is inserted into the engaging hole is formed at the engaging protrusion.

5. The signal input device of claim 1, wherein
    the sensor unit is formed of a terminal switch that includes a positive terminal and a negative terminal; and
    the contact point is an electric conductor.

6. The signal input device of claim 1, wherein the sensor unit is a touch sensor or a tactile sensor.

7. The signal input device of claim 1, further comprising a pressing button disposed on the push button and configured to operate a switch disposed therebelow when a downward external force of a reference value or more is applied, wherein
    a mouse pointing is operated when the push button is pushed sideward;
    a click signal is generated when a pressed state of the pressing button is maintained within a predetermined amount of time and then cancelled; and
    an additional function signal is generated when the pressed state of the pressing button is maintained over the predetermined amount of time and then cancelled.

8. The signal input device of claim 7, wherein a drag signal is generated when the push button is pushed sideward after the additional function signal is generated.

9. The signal input device of claim 8, wherein a drop signal is generated when the click signal is generated after the drag signal is generated.

10. The signal input device of claim 7, wherein a scroll signal is generated when the push button is pushed sideward after the additional function signal is generated.

11. The signal input device of claim 10, wherein the generation of the scroll signal is cancelled when the click signal is generated after the scroll signal is generated.

12. The signal input device of claim 1, further comprising a pressing button disposed on the push button and configured to operate a switch disposed therebelow when a downward external force of a reference value or more is applied, wherein a scroll signal or a drag signal is generated when the push button is pushed sideward in a state in which the pressed state of the pressing button is maintained.

13. The signal input device of claim 12, wherein the generation of the scroll signal or the drag signal is cancelled when the pressed state of the pressing button is cancelled after the scroll signal or the drag signal is generated.

14. The signal input device of claim 12, wherein
    one of the scroll signal and the drag signal is generated when an amount of time in which the pressed state of the pressing button is maintained is a predetermined amount of time or larger; and
    the other one of the scroll signal and the drag signal is generated when the amount of time in which the pressed state of the pressing button is maintained is less than the predetermined amount of time.

15. A signal input device comprising: a base member that includes a bottom surface and a protruding part protruding upward from the bottom surface;
    a push button disposed above the protruding part and having a downward sidewall formed to surround the protruding part;

a sensor unit disposed at any one of an outer surface of the protruding part and an inner surface of the downward sidewall; and a contact point disposed at the other one of the outer surface of the protruding part and the inner surface of the downward sidewall, and an elastic member configured to restore the push button to an original position of the push button, wherein, when the push button moves sideward, the sensor and the contact point come into contact, and a signal is generated; and a first support part is formed to protrude upward from an upper surface of the protruding part; and the elastic member is disposed between the first support part and the inner surface of the downward sidewall.

16. A signal input device comprising: a base member that includes a bottom surface and a protruding part protruding upward from the bottom surface;

a push button disposed above the protruding part and having a downward sidewall formed to surround the protruding part;

a sensor unit disposed at any one of an outer surface of the protruding part and an inner surface of the downward sidewall; and a contact point disposed at the other one of the outer surface of the protruding part and the inner surface of the downward sidewall, and an elastic member configured to restore the push button to an original position of the push button, wherein, when the push button moves sideward, the sensor and the contact point come into contact, and a signal is generated; and a first support part is formed to protrude upward from the upper surface of the protruding part;

a second support part is formed to protrude downward from a lower surface of the push button; and the elastic member is disposed between the first support part and the second support part.

17. A signal input device comprising: a base member that includes a bottom surface and a protruding part protruding upward from the bottom surface;

a push button disposed above the protruding part and having a downward sidewall formed to surround the protruding part;

a sensor unit disposed at any one of an outer surface of the protruding part and an inner surface of the downward sidewall; and a contact point disposed at the other one of the outer surface of the protruding part and the inner surface of the downward sidewall, and an elastic member configured to restore the push button to an original position of the push button, wherein, when the push button moves sideward, the sensor and the contact point come into contact, and a signal is generated; and a third support part is formed to protrude downward from the lower surface of the push button;

an insertion groove into which the third support part is inserted is formed at the upper surface of the protruding part;

and the elastic member is disposed between the third support part and an inner surface of the insertion groove.

18. A signal input device comprising: a base member that includes a bottom surface and a protruding part protruding upward from the bottom surface;

a push button disposed above the protruding part and having a downward sidewall formed to surround the protruding part;

a sensor unit disposed at any one of an outer surface of the protruding part and an inner surface of the downward sidewall; and a contact point disposed at the other one of the outer surface of the protruding part and the inner surface of the downward sidewall, and an elastic member configured to restore the push button to an original position of the push button, wherein, when the push button moves sideward, the sensor and the contact point come into contact, and a signal is generated; and a fourth support part is formed to protrude upward at a position at the bottom surface spaced apart from the outer surface of the protruding part; and the elastic member is disposed between the fourth support part and an outer surface of the downward sidewall.

19. The signal input device of claim 18, farther comprising a cover configured to surround the fourth support part and the elastic member.

20. A signal input device comprising: a base member that includes a bottom surface and a protruding part protruding upward from the bottom surface;

a push button disposed above the protruding part and having a downward sidewall formed to surround the protruding part;

a sensor unit disposed at any one of an outer surface of the protruding part and an inner surface of the downward sidewall; and a contact point disposed at the other one of the outer surface of the protruding part and the inner surface of the downward sidewall, and an elastic member configured to restore the push button to an original position of the push button, wherein, when the push button moves sideward, the sensor and the contact point come into contact, and a signal is generated; and the sensor unit is a flexible printed circuit board disposed at an outer circumference of the protruding part or an inner circumference of the downward sidewall;

the flexible printed circuit board includes a center line extending in a horizontal direction;

a first branching line branched from the center line; and at least one sensor disposed at the center line.

21. The signal input device of claim 20, wherein a switch is disposed at the first branching line; and the switch is disposed at the upper surface of the protruding part.

22. The signal input device of claim 21, further comprising a pressing button configured to apply a pressure to the switch to operate the switch.

23. The signal input device of claim 22, wherein a first through-hole is formed in the push button;

the pressing button includes a first button part disposed above the push button and a second button part disposed below the push button;

the first button part includes a contact part formed to be pressed by a user and a tint engaging part formed to extend from below the contact part to be inserted into the first through-hole; and the second button part includes a pressing part configured to come into contact with the switch to operate the switch and a second engaging part former to extend from above the pressing part and inserted into the first through-hole to be coupled to the first engaging part.

24. The signal input device of claim 23, wherein at least one of cross-sectional areas of the contact part and the pressing part is larger than a cross-sectional area of the first through-hole.

25. The signal input device of claim 23, wherein a cross-section of the contact part is formed in a convex shape so that a height of a central portion is larger than a height of a side portion.

26. The signal input device of claim 20, wherein
a switch is disposed at the first branching line;
a switch seating groove is formed at the upper surface of the protruding part; and
the switch is disposed in the switch seating groove.

27. The signal input device of claim 20, wherein a connector is formed at an end of the first branching line.

28. A signal input device comprising: a base member that includes a bottom surface and a protruding part protruding upward from the bottom surface;
a push button disposed above the protruding part and having a downward sidewall formed to surround the protruding part;
a sensor unit disposed at any one of an outer surface of the protruding part and an inner surface of the downward sidewall; and
a contact point disposed at the other one of the outer surface of the protruding part and the inner surface of the downward sidewall, and
an elastic member configured to restore the push button to an original position of the push button, wherein, when the push button moves sideward, the sensor and the contact point come into contact, and a signal is generated; and
a second through-hole passing through the base member is formed in the protruding part; and a switch is disposed at a position corresponding to the second through-hole in a circuit board of a main body in which the signal input device is installed; and
the signal input device further comprises a pressing button configured to operate the switch when inserted into the second through-hole and applying a force downward.

* * * * *